(12) United States Patent
Kwon et al.

(10) Patent No.: US 7,498,253 B2
(45) Date of Patent: Mar. 3, 2009

(54) LOCAL INTERCONNECTION METHOD AND STRUCTURE FOR USE IN SEMICONDUCTOR DEVICE

(75) Inventors: Sung-Un Kwon, Kyunggi-do (KR); Yong-Sun Ko, Kyunggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 113 days.

(21) Appl. No.: 11/679,722

(22) Filed: Feb. 27, 2007

(65) Prior Publication Data

US 2007/0141834 A1 Jun. 21, 2007

Related U.S. Application Data

(62) Division of application No. 10/861,863, filed on Jun. 4, 2004, now Pat. No. 7,202,163.

(30) Foreign Application Priority Data

Jun. 4, 2003 (KR) .............................. 2003-35875

(51) Int. Cl.
*H01L 21/4763* (2006.01)
(52) U.S. Cl. ...................... 438/618; 438/213; 438/279; 438/283; 438/637; 257/E21.575; 257/E21.577; 257/E21.585; 257/E21.59
(58) Field of Classification Search ................. 438/213; 257/E21.37
See application file for complete search history.

(56) References Cited

U.S. PATENT DOCUMENTS 5,472,901 A 12/1995 Kapoor (Continued)

OTHER PUBLICATIONS

Wolf, Stanley, Silicon Processing for the VLSI Era, vol. 2—Process Integration, Lattice Press: Sunset Beach, CA, 1990, p. 196.

*Primary Examiner*—Walter L Lindsay, Jr.
*Assistant Examiner*—Cheung Lee
(74) *Attorney, Agent, or Firm*—Marger Johnson & McCollom, P.C.

(57) ABSTRACT

A local interconnection wiring structure method for forming the same reduces the likelihood of a short between a local interconnection layer of gate electrodes and an active region by forming a common aperture so as to have a determined aperture between the local interconnection layer and the active region on an insulation film of a semiconductor substrate. Methods of forming the local interconnection wire can include forming a first etching mask pattern that has a size longer than a length between inner ends of adjacent gate electrodes formed on a semiconductor substrate and covered with an insulation film. The etching mask simultaneously has a length the same as or shorter than the length between outer ends of the gate electrodes. The insulation film exposed in the first etching mask pattern is subsequently etched so that the insulation film remains higher than a highest height of the gate electrodes, so as to form a recess pattern. The first etching mask pattern is then removed and a second etching mask pattern is formed so as to partially expose the insulation film provided within the recess pattern. The insulation film within the recess pattern is etched to form apertures for exposing a partial surface of the gate electrodes. The second etching mask pattern is then removed. The recess pattern and the apertures are then filled with conductive material to form a local interconnection layer for connecting between the gate electrodes.

16 Claims, 11 Drawing Sheets

U.S. PATENT DOCUMENTS

| | | |
|---|---|---|
| 5,831,899 A | 11/1998 | Wang et al. |
| 6,803,318 B1 | 10/2004 | Qiao et al. |
| 6,806,180 B2 | 10/2004 | Cho et al. |
| 7,041,586 B2 | 5/2006 | Kudo et al. |
| 2002/0093111 A1 | 7/2002 | Ohbayashi |
| 2002/0180068 A1 | 12/2002 | Clevenger et al. |
| 2004/0018725 A1 | 1/2004 | Cho et al. .................. 438/672 |

LOCAL INTERCONNECTION METHOD AND STRUCTURE FOR USE IN SEMICONDUCTOR DEVICE

This is a Divisional of U.S. patent application Ser. No. 10/861,863, filed on Jun. 4, 2004, now pending, which claims priority from Korean Patent Application No. 2003-35875, filed on Jun. 4, 2003, the entire contents of which are hereby incorporated by reference.

FIELD OF THE INVENTION

This disclosure relates to a manufacturing of semiconductor devices, and more particularly, to a local interconnection structure and method of connecting between conductive layers such as an active region or a gate electrode of a semiconductor device, etc.

BACKGROUND OF THE INVENTION

Requirements for lower electricity consumption and higher performance semiconductor devices has gradually increased. This has brought about continuous research and development to obtain high integration and high-speed operation of semiconductor devices. The continuously increasing integration is limited by the size of local interconnection wiring process of locally connecting conductive layers.

Since in a static random access memory (SRAM) having a full CMOS memory cell, a one unit memory cell is constructed of six MOS transistors, the number of contacts connecting transistors to fabricate a unit memory cell increases more than for other kinds of memory cells. For example, a contact of tungsten (W) matter having a pitch of 0.20 μm should be formed when a high integration semiconductor device has a design rule for an interval under 0.10 μm therefore, but it is actually impossible to obtain a contact patterning of such a size even if the current advanced technique of lithography is used.

Therefore, a method of overcoming the difficulty for the contact patterning and for reducing the number of contacts can be obtained by a local interconnection wire for locally connecting gate electrodes and/or active regions of a semiconductor device.

FIGS. 1a through 1e illustrate sequential processes of forming a local interconnection wire by forming a common aperture for connecting gate electrodes according to one of various conventional techniques related to the local interconnection wire.

Referring first to FIG. 1a, an oxide film 2 and a polysilicon film 3 are sequentially accumulated entirely on a p-type semiconductor substrate 1, and a patterning is then performed through a photolithographic process, to obtain a gate pattern 4 formed on the gate oxide film 2. The gate pattern 4 is used as an ion implantation mask, to implant an n-type impurity ion by a relatively low energy into the semiconductor substrate 1 so as to form a low density source/drain region 6 to then form a gate spacer 7 at the sidewalls. The gate spacer 7 is used as an ion implantation mask, to implant an impurity ion by a relatively high energy into the low density source/drain region 6, so as to form a high density n-type (n+) source/drain region 8 having an impurity of density higher than the low density at a portion of the low density source/drain region 6. The low density source/drain region 6 and the high density source/drain region 8 constitute an LDD (lightly doped drain)-type source/drain region 9 as an active region that is designated by a reference number 9 in the drawing. Subsequently, a refractory metal such as cobalt (Co), etc. is entirely deposited thereon, to be then thermal processed, thus forming a metal silicide film 5 having a resistance value lower than a resistance value of the polysilicon film 3 on an upper part of the gate pattern 4. The gate pattern 4 and the metal silicide film 5 together constitute a gate electrode 13, 14. Then, entirely thereon, an etch stop film 10 is formed, and an insulation film such as a BPSG film, etc. is then deposited overall. This insulation film is well known as an interlayer insulation film 12 in this field since it is positioned between an upper layer and a lower layer thereof to serve an isolation function.

Next, referring to FIG. 1b, a flattening process is executed and a deposition process is then performed to form a hard mask. The flattening process such as a chemical mechanical polishing (CMP) is progressed after the process of FIG. 1a, to flatten the interlayer insulation film 12. Then, a SiN/SiON film 15 is deposited on the interlayer insulation film 12 to become a hard mask. This SiN/SiON film 15 is deposited to increase etching precision of the etching process to be executed in a post process.

With reference to FIG. 1c, a photoresist pattern for exposing an interval (l) between gate electrodes 13, 14 which will be connected with each other, is formed, and next, the interlayer insulation film 12 and the etch stop film 10 in the interval (l) are sequentially etched to expose a surface of the gate electrodes 13, 14, to thus form a common aperture (ha). In this case, the surface of the gate electrodes 13, 14 is formed with a metal silicide film 5, while, the upper part of the active region 9 is formed with the interlayer insulation film 12, thus the upper part of the active region 9 is excessively etched in that sequential etching process. If the interlayer insulation film 12 becomes too thin by the excessive etching, it will be difficult to guarantee a determined thickness margin. That is, a local interconnection layer 16 of FIG. 1d that will to be filled into the common aperture (ha) may be directly contacted with an upper part of the active region 9, forming a short circuit, or short. For example, if the thickness of the polysilicon film 3 is under 1200 Å, shorts can be generated very frequently.

Although the SiN/SiON film 15 was conventionally deposited to be used as the hard mask, it was still very difficult to substantially reduce the occurrence probability of short between the local interconnection layer 16 and the active region 9 caused by excessive etching of the interlayer insulation film 12 formed on the active region 9.

After the process of FIG. 1c, the metal filling process and the flattening process are progressed, hence the local interconnection layer 16 is obtained as shown in FIG. 1d. Describing FIG. 1d more in detail, the metal layer is entirely deposited into the common aperture (ha) to form the local interconnection layer 16, and then a flattening process such as CMP is executed, to thus form the local interconnection layer 16 for connecting the gate electrodes 13, 14.

With reference to FIG. 1e, since the SiN/SiON film 15 as the hard mask is not completely removed by the flattening process, the local interconnection layer 16 is re-etched, which completely removes the remaining SiN/SiON film 15. Then, the surface of the local interconnection layer 16 still having an irregularity is flattened again.

As was described above, according to the prior art of FIGS. 1a through 1e, the etching process of the hard mask composed of the SiN/SiON film, etc. and the flattening process of the local interconnection layer, are required separately by the hard mask forming process, thus there are many process steps. This increases the manufacturing cost for semiconductor devices.

FIGS. 2a through 2d sequentially illustrate processes of forming a common aperture for connecting gate electrodes to produce the local interconnection wire, according to an aspect of the prior art.

The processes until the forming process of the interlayer insulation film are the same as or similar to the description of FIG. 1a, after at least two MOS transistors are formed on a semiconductor substrate, hence, the duplicated description will be omitted from the following and will be described thereafter.

Referring first to FIG. 2a, the flattening process such as CMP, etc. is executed to flatten the interlayer insulation film 12 of an oxide series already formed in the previous process, and the SiN/SiON film 15 which is to become the hard mask is deposited on this interlayer insulation film 12. The SiN/SiON film 15 is then deposited to increase etching precision of the etching process that will be performed in a post process. Subsequently, a photoresist pattern is formed to expose an interval ($l_1$) between the gate electrodes 13, 14 which will be connected with each other and expose a portion ($l_2$) of the active region 11 formed from the outer ends of the gate electrodes 13, 14. Next, the interlayer insulation film 12 and the etch stop film 10 within the interval ($l_1$) are sequentially etched so as to expose the surface of the gate electrodes 13, 14, to thus form the common aperture (ha) and a first recess pattern (hb) of the active region 11. In this case, the surfaces of the gate electrodes 13, 14 are formed with the metal silicide film 5, while, an upper part of the active region 9 is formed with the interlayer insulation film 12, thus the upper part of the active region 9 can be etched excessively in that sequential etching process. If the interlayer insulation film 12 is thinned by the excessive etching, a given thickness margin cannot be guaranteed. That is, it may cause a short where the local interconnection layer 16 of FIG. 1d filled into the common aperture (ha) is directly contacted with the upper part of the active region 9.

With reference to FIG. 2b, the pattern exposing the portion ($l_2$) of the active region 11, namely, the first recess pattern (hb), is formed, and the interlayer insulation film 12 and the etch stop film 10 within the first recess pattern are sequentially etched so as to expose the surface of the active region 11, to thus form a second recess pattern (hc) of the active region 11.

After the process of FIG. 2b, a metal filling process and a flattening process are performed to obtain the local interconnection layer 16 shown in FIG. 2c. Describing FIG. 2c more in detail, a metal layer is entirely deposited to form the local interconnection layer 16 in the common aperture (ha) and in an aperture (hd) of the active region as the first and second recess patterns (hb, hc). Then, a flattening process such as CMP is progressed to form the local interconnection layer 16 for locally connecting between the gate electrodes 13, 14 and between the active regions.

Referring to FIG. 2d, since the SiN/SiON film 15 used as the hard mask is not completely removed by the flattening process, the local interconnection layer 16 is re-etched so as to completely remove the remaining SiN/SiON film 15. After completely removing the remaining SiN/SiON film 15, the process of flattening the surface of the local interconnection layer 16 whose surface is irregular is again performed.

That is, the prior art requires the deposition process of the SiN/SiON film 15 and the specific etching and flattening processes for the removal of the SiN/SiON film 15.

In the following, several problems of the local interconnection wire forming method of the prior art are described.

First, the higher the integration of a memory device is, the more the number of contacts at a given area is increased. In order to solve this problem, a local interconnection wire for locally connecting between gate electrodes and between active regions is formed, but if an interlayer insulation film is thinned by an excessive etching, a determined thickness margin cannot be guaranteed and this brings about a high occurrence probability for a short between a local interconnection layer and an upper part of active region.

Second, in order to prevent this short between the local interconnection layer of gate electrodes and the active region, a SiN/SiON film is deposited before an etching process of the interlayer insulation film, and is then used as a mask, to thus increase precision of the etching process. However, an etching process for the hard mask constructed of the SiN/SiON film, etc. and a flattening process for the local interconnection layer are needed separately due to the hard mask formation process, thus there are a large number of process steps. This increases the manufacturing cost of semiconductor devices.

Embodiments of the invention address these and other limitations in the prior art.

SUMMARY OF THE INVENTION

A feature of embodiments of the present invention is, therefore, to provide a local interconnection structure and a method of forming the local interconnection wiring structure in a semiconductor device.

Another feature of embodiments of the present invention is to provide a local interconnection structure and a method of forming the wiring structure in a semiconductor device, which is capable of sufficiently guaranteeing a thickness margin of an interlayer insulation film formed on an active region.

Still another feature of embodiments of the present invention is to provide a local interconnection structure and a method of forming the wiring structure in a semiconductor device, which is capable of reducing or fundamentally preventing a short caused by a contact between a local interconnection layer and an active region of a semiconductor device.

Yet another feature of embodiments of the present invention is to provide a method of forming an interconnection wire without forming a hard mask on an interlayer insulation film.

Another feature of embodiments of the present invention is to provide a local interconnection wire forming method to reduce the number of process steps required for a formation of interconnection wire and thus reduce a manufacturing cost of semiconductor devices.

An additional feature of embodiments of the present invention is to provide a local interconnection wire forming method and structure capable of increasing a manufacturing yield and enhancing a performance of the interconnection wire in a semiconductor device.

BRIEF DESCRIPTION OF THE DRAWINGS

The above and other features of exemplary embodiment of the present invention will become readily apparent from the description of the exemplary embodiments that follows, with reference to the attached drawings.

DETAILED DESCRIPTION OF EXEMPLARY EMBODIMENTS

According to exemplary embodiments of the present invention, local interconnection structure and method will be described with reference to FIGS. 3 through 6.

It will be understood by those skilled in the art that the present invention can be embodied by numerous different types and is not limited to the following described embodiments. The following various embodiments are exemplary in nature. Accordingly, details of like components have been omitted so that the invention can be clearly presented.

Figure 5A:
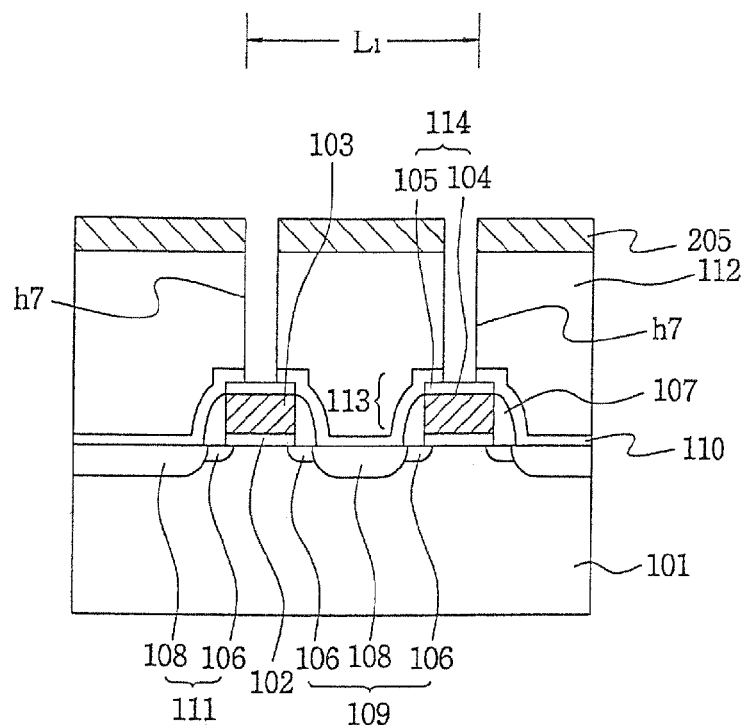
FIGS. 5a and 5b are cross-sectional views for a sequential process of local interconnection wire according to other embodiments of the present invention.
Figure 5B:
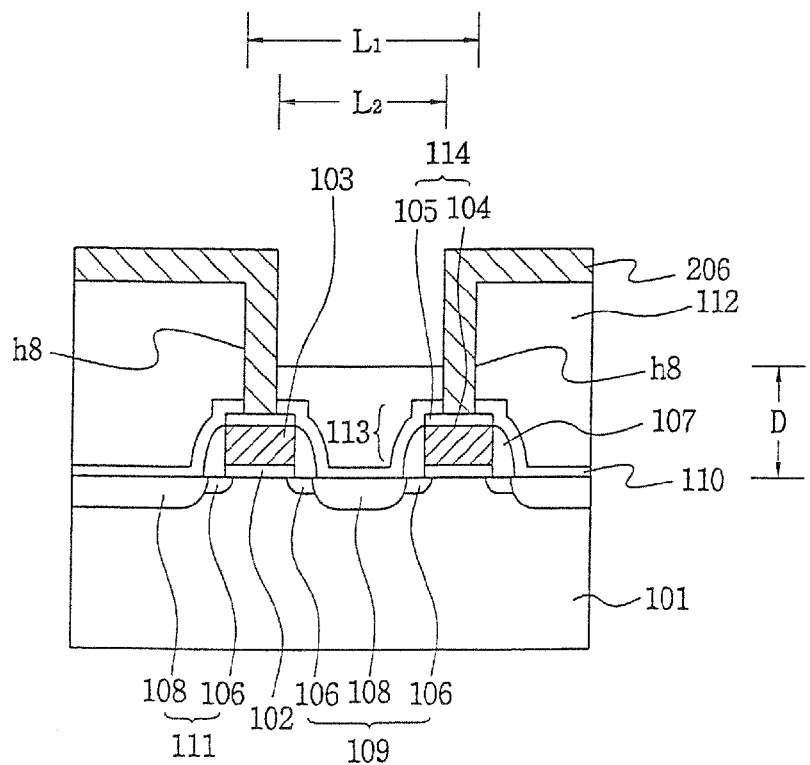
Figure 6A:
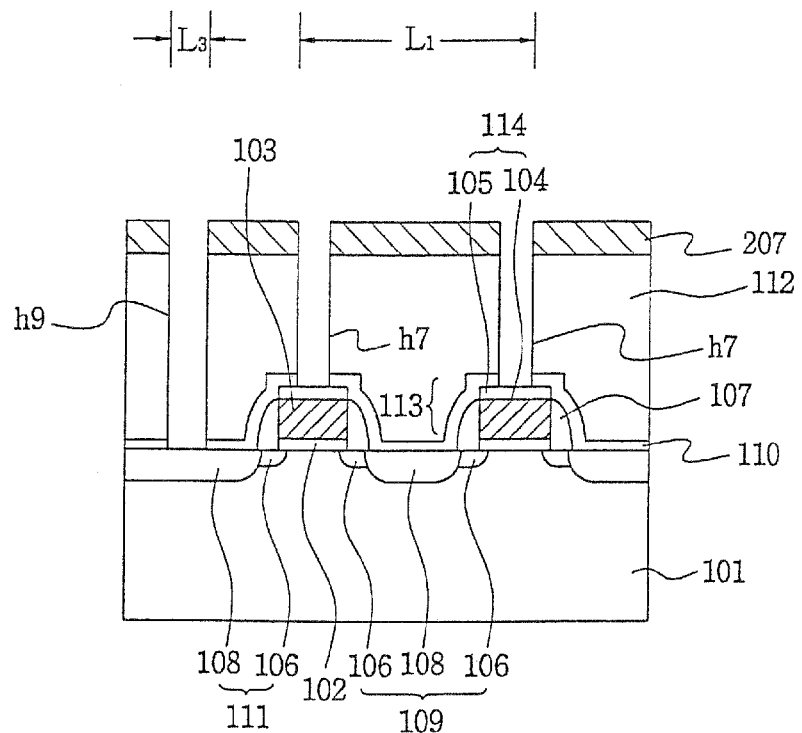
FIGS. 6a and 6b are cross-sectional views illustrating a sequential process of local interconnection wire according to yet other embodiments of the present invention.
Figure 6B:
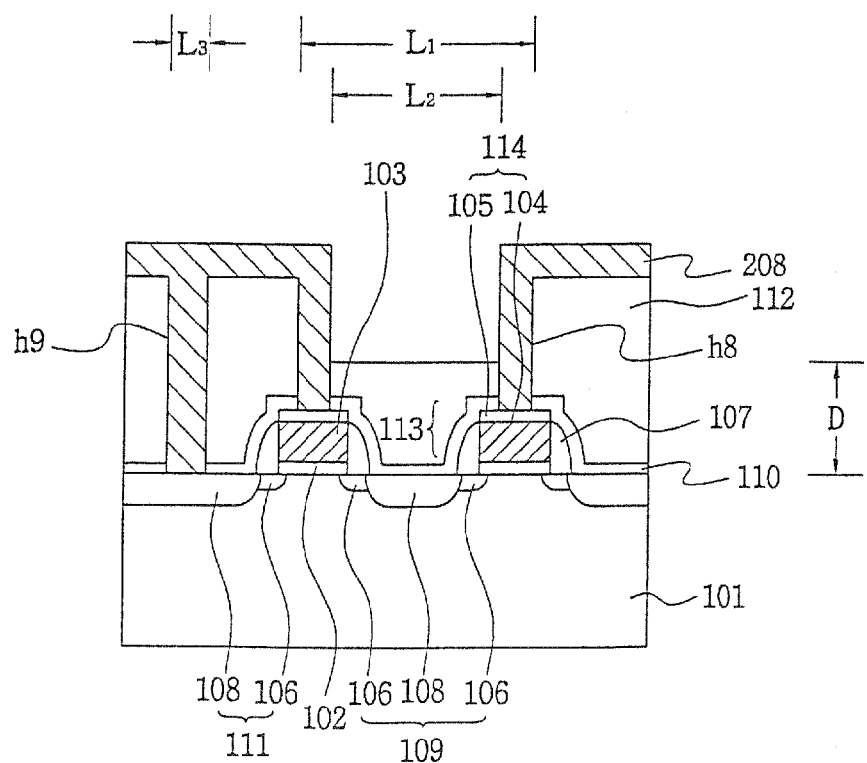

FIGS. 3a through 3e are cross-sectional views showing a sequential process of local interconnection wire according to exemplary embodiments of the present invention. FIGS. 4a through 4d illustrate other exemplary embodiments, FIGS. 5a and 5b illustrate still other exemplary embodiments, and FIGS. 6a and 6b illustrate yet other exemplary embodiments. These figures are all cross-sectional views each illustrating a sequential process of local interconnection wire.

Figure 1A:
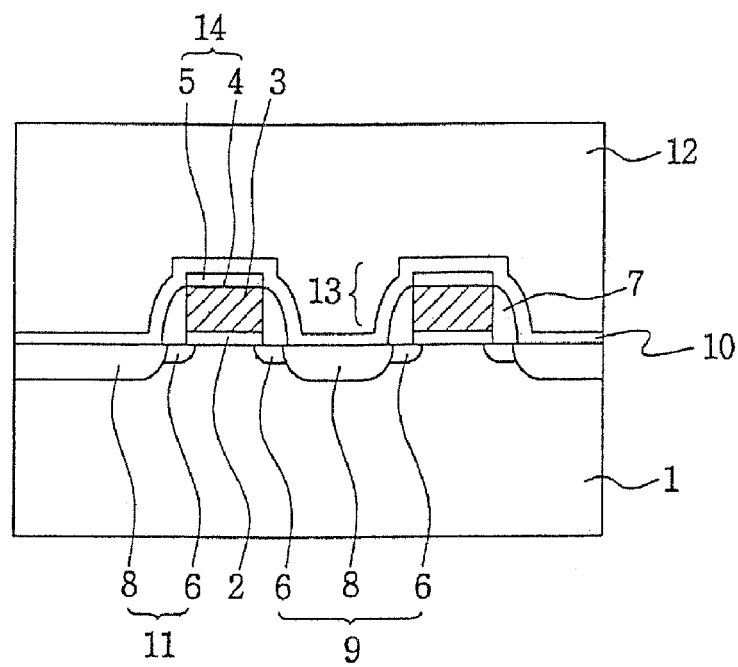
FIGS. 1a through 1e are sequence cross-sectional diagrams illustrating a process of a local interconnection wire according to one aspect of the prior art.
Figure 1B:
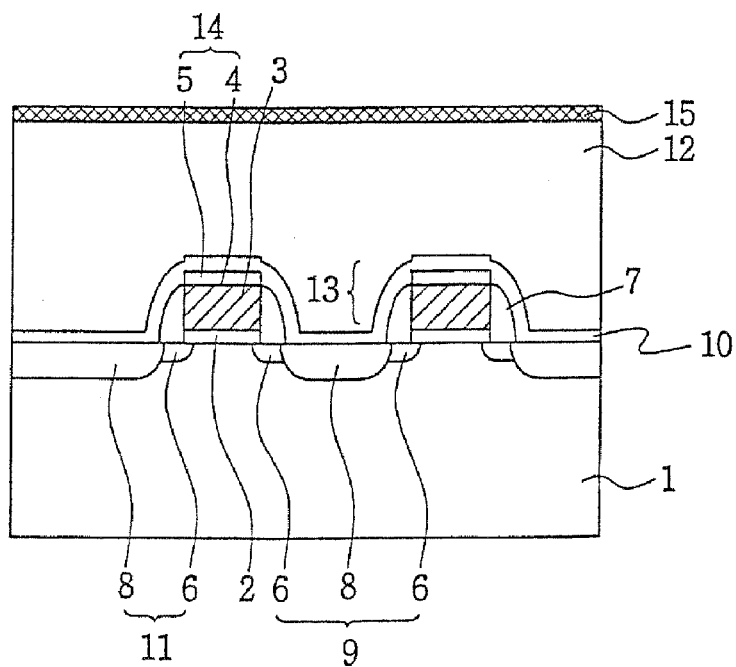
Figure 1C:
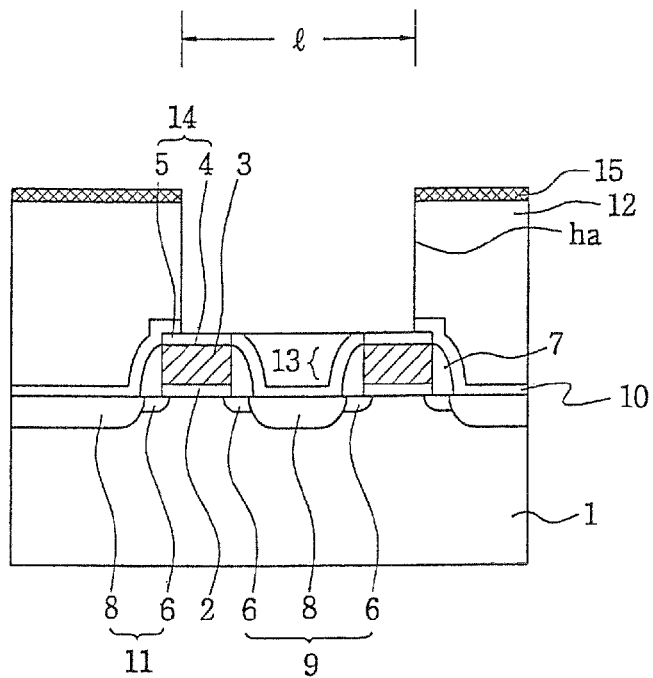
Figure 1D:
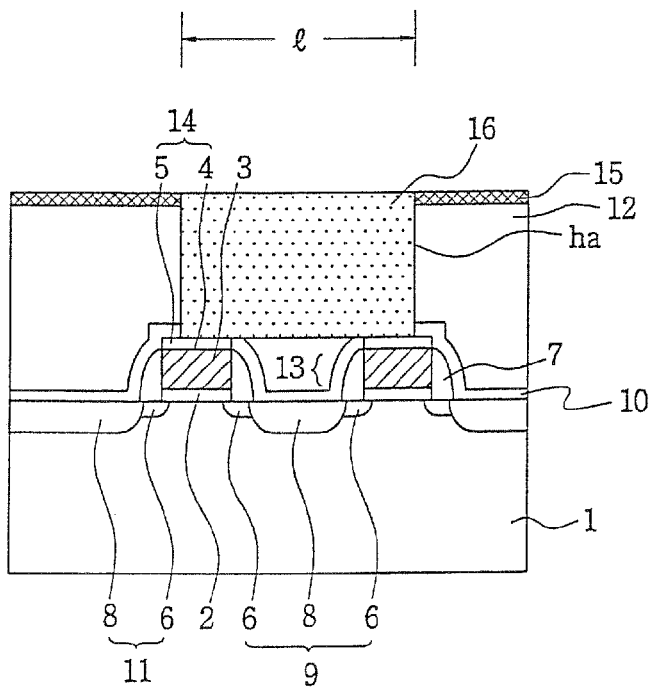
Figure 1E:
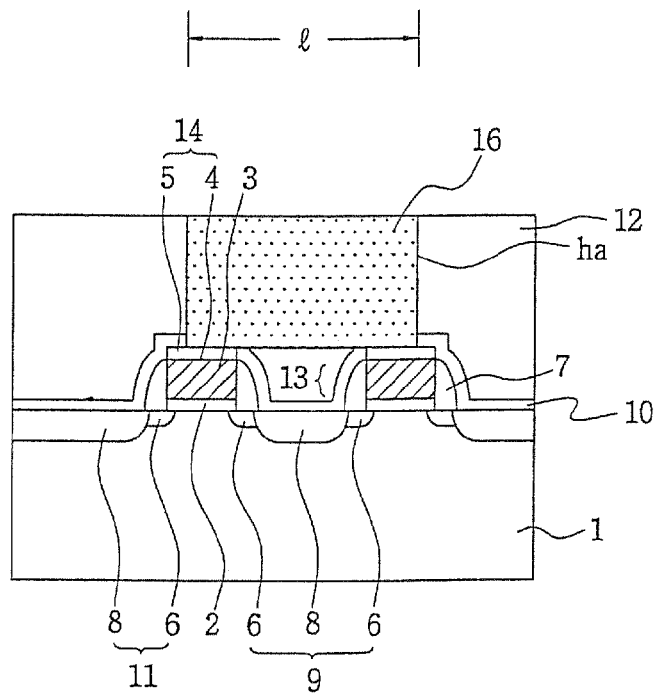
Figure 2A:
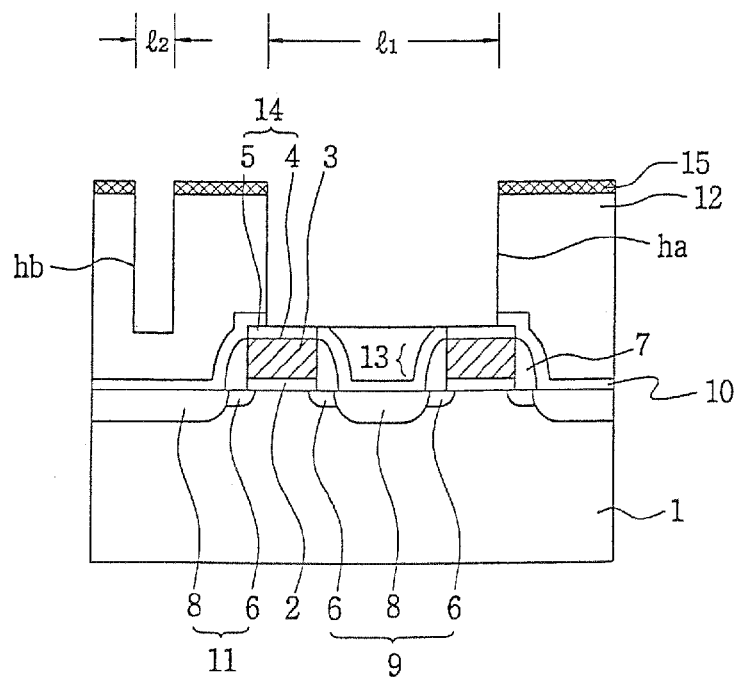
FIGS. 2a through 2d are sequence cross-sectional diagrams illustrating a process of a local interconnection wire according to another aspect of the prior art.
Figure 2B:
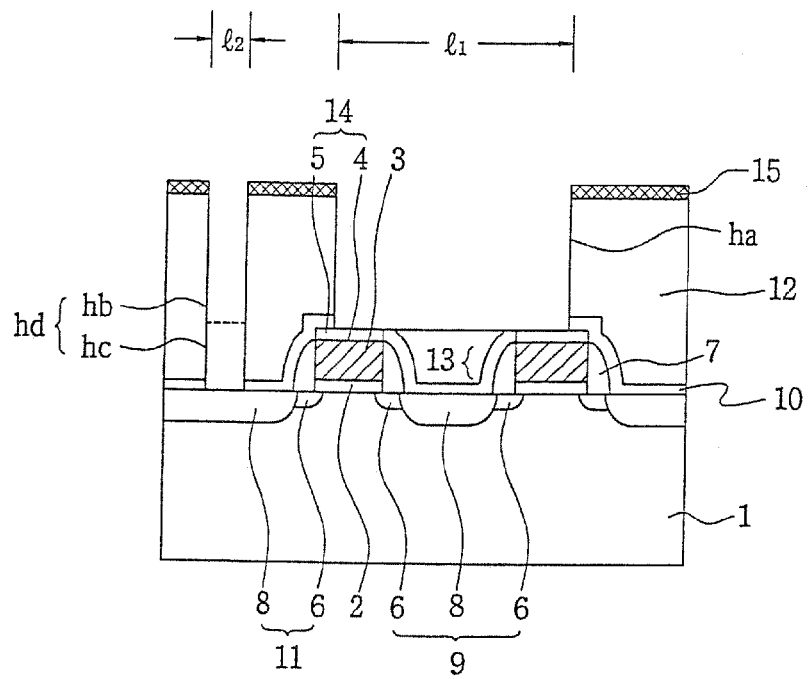
Figure 2C:
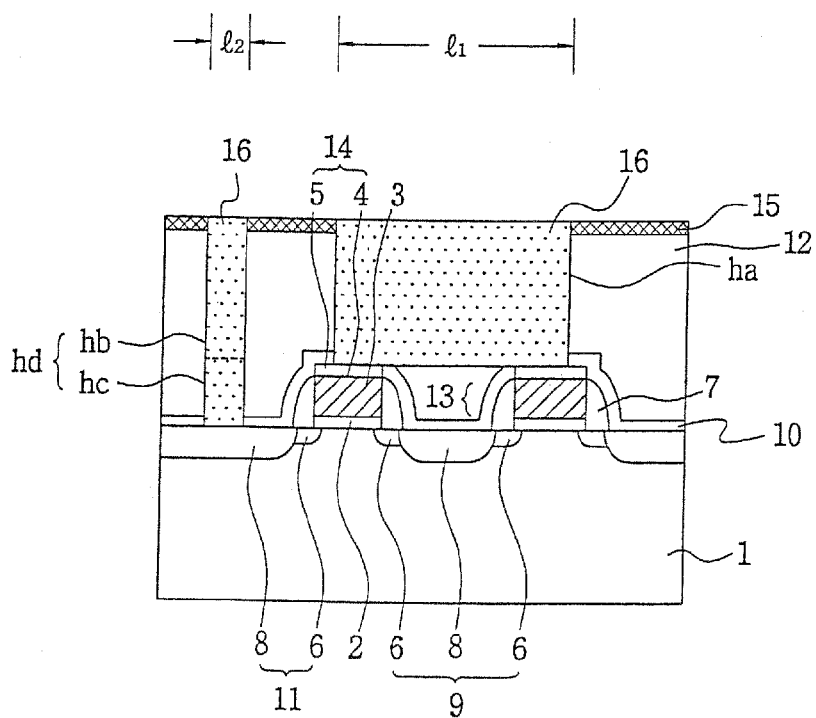
Figure 2D:
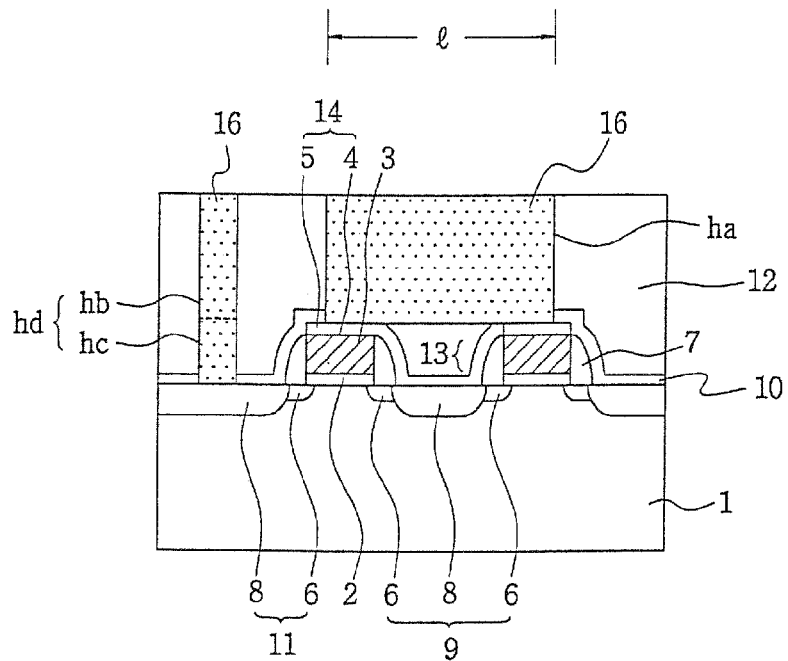

As shown in the first drawings of the exemplary embodiments, at least two MOS transistors are formed on a semiconductor substrate, and the processes executed until forming an interlayer insulation film the same as or similar to the description of FIG. 1A, thus a detailed description will be omitted for the brevity.

Figure 3A:
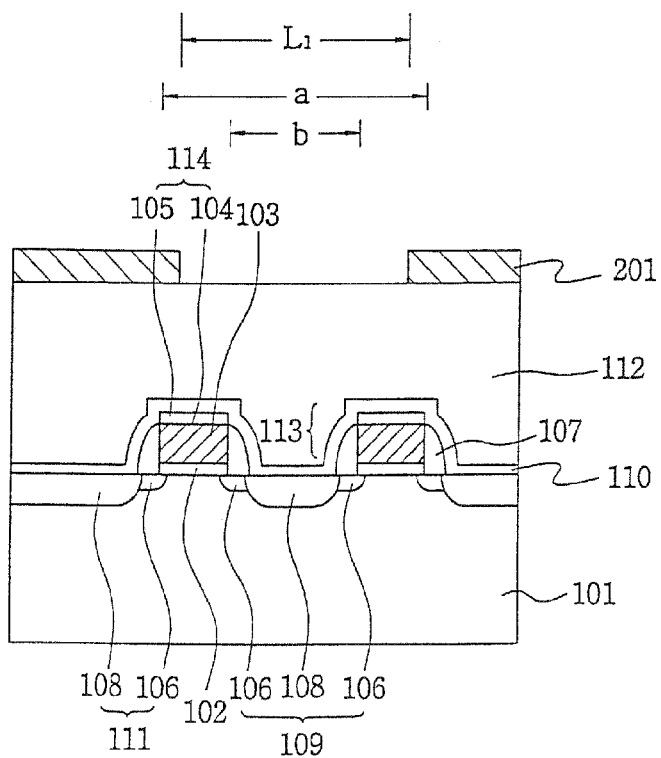
FIGS. 3a through 3e are cross-sectional views sequentially showing a process of local interconnection wire according to embodiments of the present invention.

Referring first to FIG. 3a, an interlayer insulation film 112 of an oxide series already formed in the previous process is flattened, then a photoresist pattern 201 is formed on the flattened interlayer insulation film 112 as a first etching mask pattern for exposing an interval L1 that becomes a size of a local interconnection wire for connecting between gate electrodes. The interval L1 has a size at least longer than a length (b) between inner side ends of the gate electrodes 113, 114 and simultaneously has a size the same as or shorter than a length (a) between outermost side ends of the gate electrodes, and connects between the gate electrodes. The pattern 201 is formed by covering the interlayer insulation film 112 covering a semiconductor substrate 101 with a photosensitive film, e.g., photoresist and next by performing a photolithographic process. In this exemplary embodiment of the invention the process of depositing SiN/SiON on the interlayer insulation film after the flattening process is unnecessary, differently then in the prior art. The reason therefore will be definitively described in the post-mentioned process.

Figure 3B:
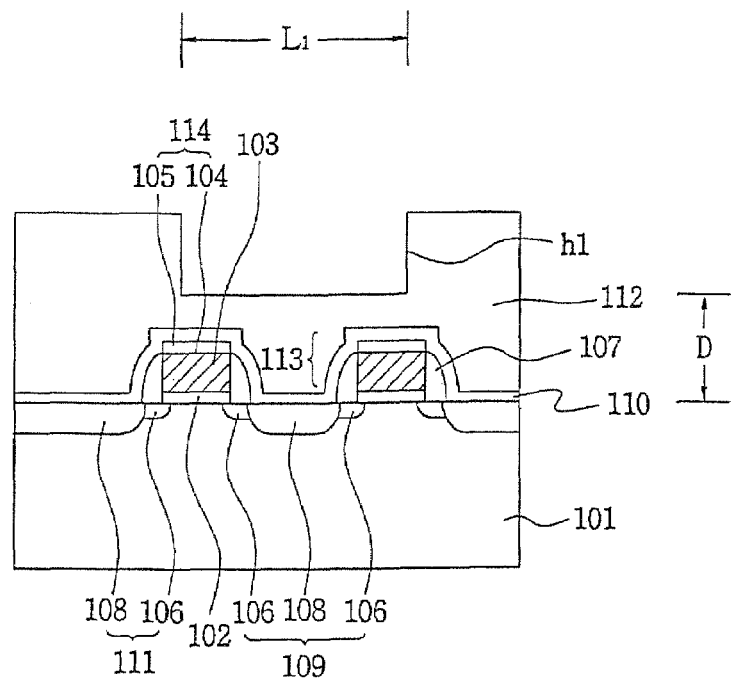

Referring to FIG. 3b, the interlayer insulation film 112 exposed into the pattern by using the photoresist pattern 201 as the etching mask is etched through a dry etching process such as a plasma dry etching process, etc. to form a recess pattern h1 for guaranteeing a determined thickness D of the interlayer insulation film 112 within the pattern 201. In this etching, an etching apparatus should be controlled enough to prevent a short between a local interconnection layer 116 (FIG. 3e) and an active region 109. This etching is also desirably performed so as to become roughly horizontal with the active region of the semiconductor substrate 101. That is, it should be etched so that the insulation film remains at least higher than the highest height of the gate electrodes, and it is desirable to form the thickness D of the interlayer insulation film 112 between about 1200 to 1700 Å. Subsequently, the photoresist pattern 201 remaining on the interlayer insulation film 112 is removed through an ashing process, and results similar to that illustrated in FIG. 3b.

As can be seen in FIG. 3b, in this exemplary embodiment of the present invention, the recess pattern h1 is formed for securing the determined thickness D of the interlayer insulation film 112 within the photoresist pattern 201, thus etching precision is not as critical as compared with the prior art. That is, to prevent the short between the local interconnection layer 116 (FIG. 3e) of the gate electrodes 113, 114 and the active region 109, the process of forming the hard mask such as SiN/SiON, etc. is omitted in this exemplary embodiment of the present invention, different from the prior art, which reduces the number of process steps. It is also axiomatic that the process of removing the hard mask is unnecessary in the next process.

Figure 3C:
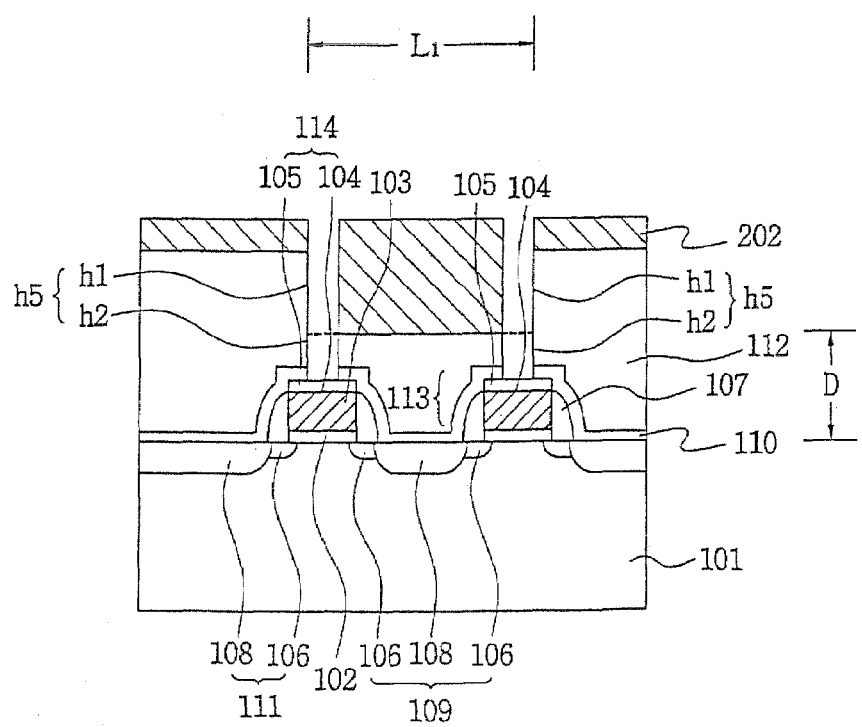

With reference to FIG. 3c, a photoresist pattern 202 is formed as a second etching mask pattern for exposing a portion of the gate electrodes 113, 114. The pattern 202 is formed by depositing a photoresist on the interlayer insulation film 112 and the recess pattern h1 through, for example, a spin coating method using spinner equipment, and then performing a photolithographic process using a block layer as an exposure mask for exposing a portion of the gate electrodes 113, 114 and blocking a portion except for the exposed portion of the gate electrodes. Subsequently, the interlayer insulation film exposed in the pattern is etched through a dry etching method by using the photoresist pattern 202 as an etching mask. Next, an etch stop film 110 formed on the gate electrodes 113, 114 is etched so as to partially expose a surface of the gate electrodes, to thus form apertures h2. The recess pattern h1 and the apertures h2 together are provided as a common aperture h5 for connecting the gate electrodes, which has a reverse (or upside-down) U-shape. Then, the remaining photoresist pattern 202 is removed through, for example, an ashing process.

Figure 3D:
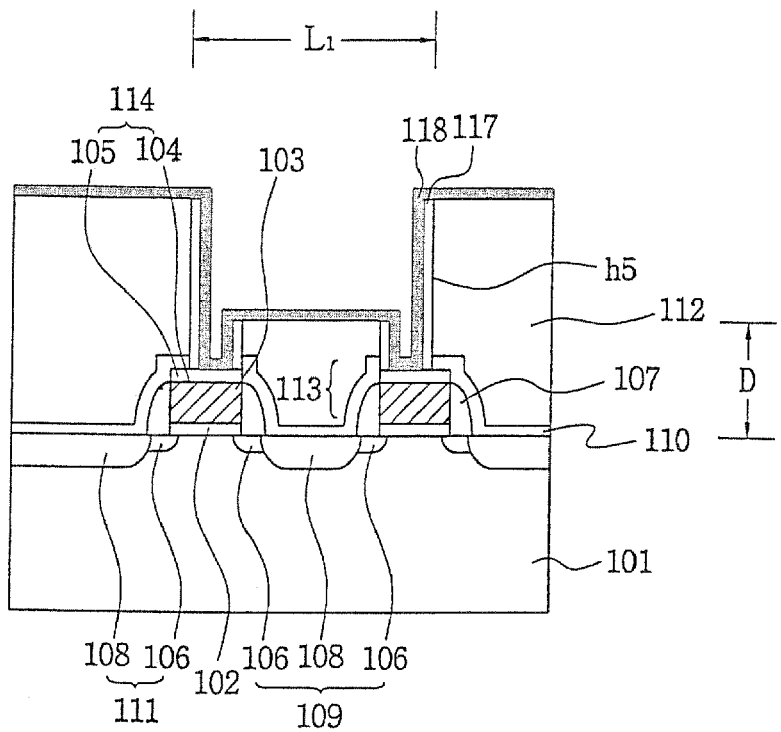

With reference to FIG. 3d, the pattern 202 is removed from FIG. 3c, and an insulation film 117 of, for example, a SiN series is entirely deposited in the common aperture h5 obtained through a connection of the recess pattern h1 and the apertures h2. Then, the insulation film 117 is etched to expose a partial surface of the gate electrodes 113 and 114, and a metal film 118 is deposited in the common aperture h5. The metal film 118 can be made of titanium-containing material such as Ti and TiN. It is herewith desirable to form the metal film 118 by a sequence of Ti and TiN. The titanium film is deposited to provide a contact resistance lower than the contact resistance caused when the local interconnection layer 116 (FIG. 3e) and the gate electrodes 113, 114 are directly contacted with each other. Also, the TiN film is deposited to increase the capacity of the metal film 118. The aperture h5 can be filled with a metal layer of titanium-containing material.

Figure 3E:
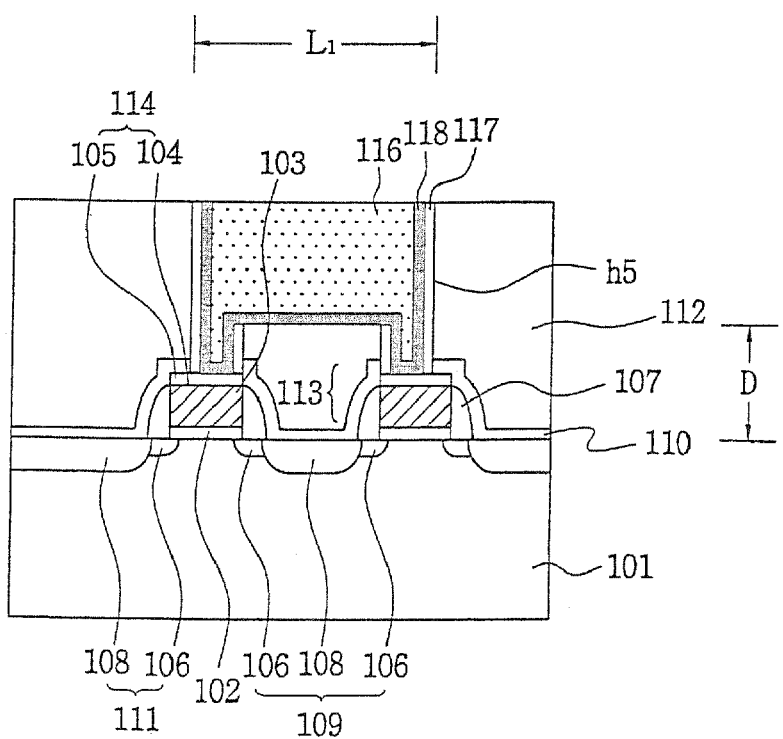

Referring to FIG. 3e, the common aperture h5 is filled with conductive material such as Al or W or their compound layer, to thus form the metal layer 116 as a local interconnection wiring layer for connecting the gate electrodes. After forming the metal layer 116, a flattening process such as CMP is performed for the metal layer 116, resulting in a device as illustrated in FIG. 3e.

Consequently, the embodiments of the invention illustrated in FIGS. 3a-3e do not use a hard mask, thus a process for its removal is not needed, and differently from the prior art, a re-execution of the CMP process is also not needed. That is, the manufacturing cost of semiconductor devices can be reduced.

FIGS. 4a to 4d show sequential formation procedures of a local interconnection wire according other embodiments of the present invention.

Figure 4A:
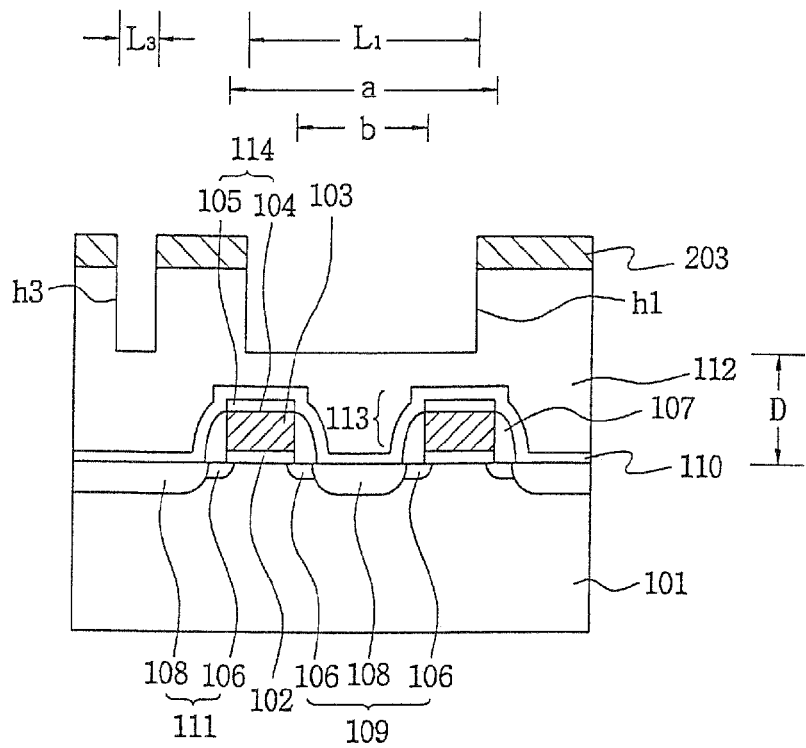
FIGS. 4a through 4d are cross-sectional views illustrating a sequential process of local interconnection wire according to other embodiments of the present invention.

Referring first to FIG. 4a, the interlayer insulation film 112 of an oxide series already formed in the previous process is flattened by a flattening process such as CMP, etc. Then, a photoresist pattern 203 as a first etching mask pattern is formed on the flattened interlayer insulation film 112. The photoresist pattern 203 facilitates an independent exposure in interval $L_1$ that becomes the size of a local interconnection wire for connecting between the gate electrodes, and in a portion $L_3$ of an active region 111 formed outside the outer ends of the gate electrodes. The interval $L_1$ has a size at least longer than a length (b) between inner side ends of the gate electrodes, and simultaneously has a size the same as or shorter than a length (a) between outermost side ends of the gate electrodes, so as to connect between the gate electrodes. The pattern 203 is formed by covering the interlayer insulation film 112 covering the semiconductor substrate 101 with a photosensitive film, e.g., photoresist, and then by performing a photolithographic process. After the flattening process, the process of depositing SiN/SiON on the interlayer insulation film is unnecessary in this exemplary embodiment of the invention, also different from the prior art.

The interlayer insulation film 112 exposed into the pattern by using the photoresist pattern 203 as an etching mask is etched using a dry etching process such as plasma dry etching process, etc. Thus, the first recess pattern h1 of the gate electrodes 113, 114 and the second recess pattern h3 formed over a portion of the active region are formed for guaranteeing a determined thickness D of the interlayer insulation film 112 within the pattern 203. In this etching, an etching apparatus should be controlled so as to form an aperture enough to prevent a short between the local interconnection layer 116 (FIG. 4d) and the active region 109. This etching is desirably performed so as to become roughly horizontal with the active region of the semiconductor substrate 101. It should be thus etched so that the insulation film is remains at least higher than the highest height of the gate electrodes, and the interlayer insulation film is desirably formed to a thickness of between approximately 1200 and 1700 Å. Subsequently, the photoresist pattern 203 remaining on the interlayer insulation film 112 is removed through an ashing process, for example.

Figure 4B:
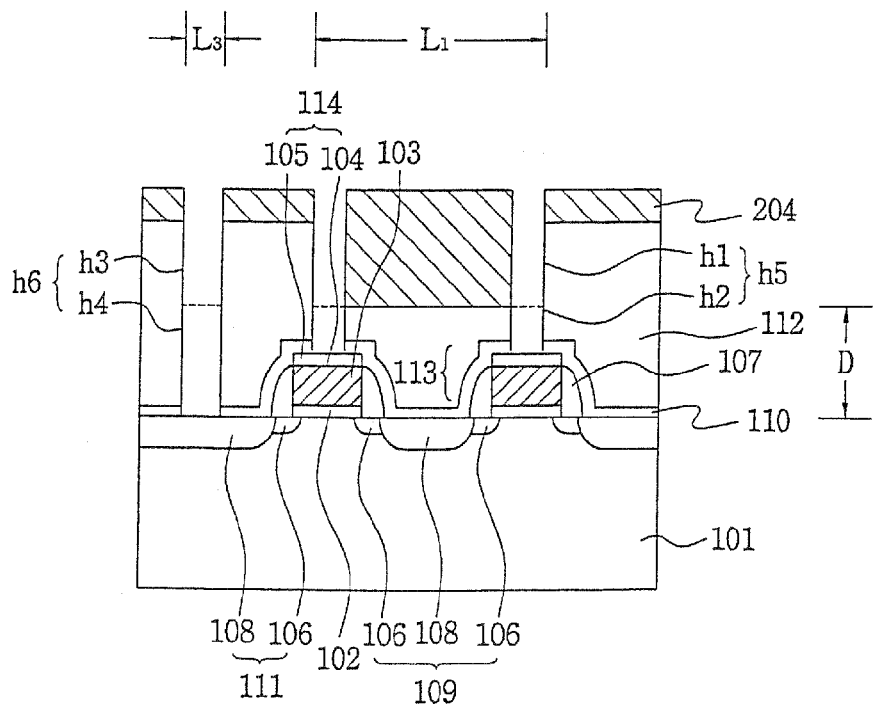

Referring to FIG. 4b, a photoresist pattern 204 is formed as a second etching mask pattern to expose a portion of the first recess pattern h1 and the second recess pattern h3 of the active region 111. The pattern 204 is formed by depositing the photoresist on the interlayer insulation film 112 and the first recess pattern h1 through a spin coating method, and then, by performing the photolithographic process using a block layer as an exposure mask. The block layer as the exposure mask is provided to expose the portion of the first recess pattern h1 and the second recess pattern h3 of the active region, and to block a portion excepting the exposed portion of the first recess pattern h1 and the second recess pattern h3 of the active region. Next, the photoresist pattern 204 is used as an etching mask to sequentially etch the interlayer insulation film exposed in the pattern 204 through a dry etching method, and then to etch the etch stop film 110 so that a partial surface of the gate electrodes 113, 114 and the portion $L_3$ of the active region are exposed. Simultaneously to that, a first aperture h2 of the gate electrodes 113, 114 and a second aperture h4 of the active region are formed. The recess pattern h1 and the first apertures h2 together are provided as the common aperture h5 for connecting between the gate electrodes, which has an upside-down U-shape. The second recess pattern h3 and the second aperture h4 are provided as a single aperture h6 of the active region. The remaining photoresist pattern 204 is then removed through an ashing process, for example.

Figure 4C:
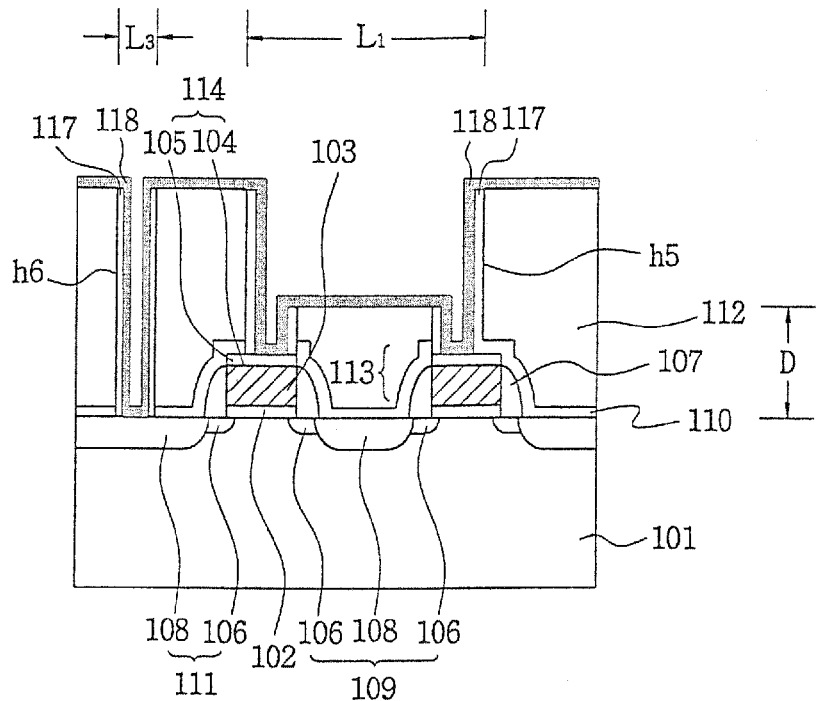

Referring to FIG. 4c, after removing the pattern 204 from FIG. 4b, an insulation film 117 of, for example, a SiN series is entirely deposited in the common aperture h5 and in the aperture h6 of the active region. The insulation film 117 is then etched to expose a partial surface of the gate electrodes 113, 114 and a partial surface $L_3$ of the active region. Next, the metal film 118 can be deposited in the common aperture h5 and the aperture h6 of the active region, wherein the metal film 118 is made of titanium-containing material such as Ti and TiN. It is desirable to form the metal film by a sequence of Ti and TiN. The Ti film is deposited to provide a contact resistance lower than a contact resistance caused when the local interconnection layer 116 and the gate electrodes 113, 114 are directly contacted with each other. The TiN film is deposited to increase a capacity of the metal film. Further, the common aperture h5 and the aperture h6 of the active region can be, of course, formed as a metal layer of titanium-containing material.

Figure 4D:
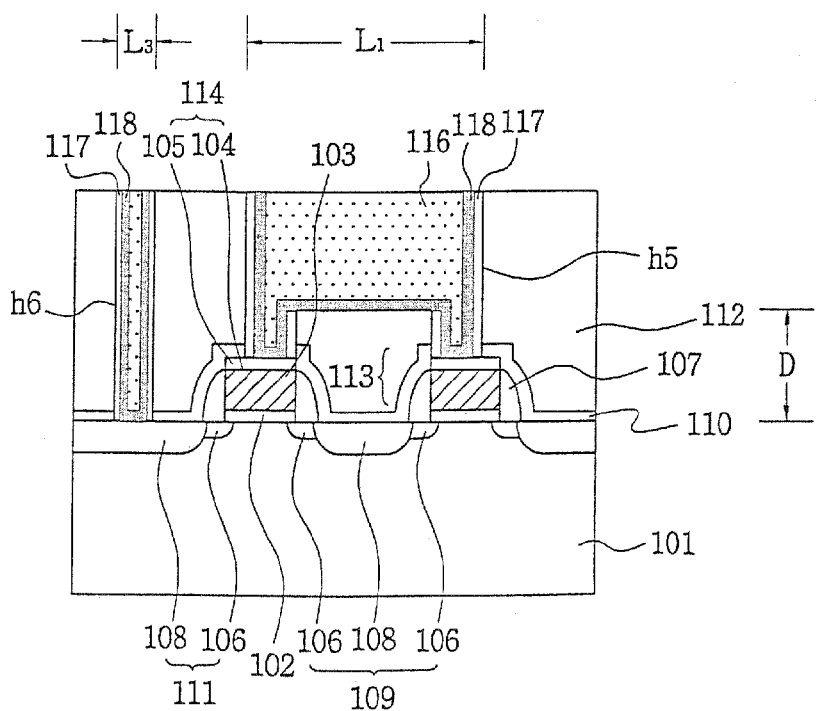

With reference to FIG. 4d, the common aperture h5 and the aperture h6 of the active region are filled with conductive material such as Al or W or their compound layer, to thus form the metal layer 116 as the local interconnection wiring layer for connecting between the gate electrodes 113, 114. After forming the metal layer 116, a flattening process such as CMP, etc. is executed resulting in a product similar to that as illustrated in FIG. 4d.

FIGS. 5a and 5b are cross-sectional views showing a sequential process of a local interconnection wire according to still other embodiments of the present invention.

Referring first to FIG. 5a, the interlayer insulation film 112 of an oxide series already formed in the previous process is flattened by a flattening process such as CMP, etc. Subsequently, a photoresist pattern 205 is formed on the flattened interlayer insulation film 112 as a first etching mask pattern for independently exposing a portion of the gate electrodes. The photoresist pattern 205 is then used as an etching mask, to etch the interlayer insulation film exposed into the pattern using, for example, a dry etching process and to etch the etch stop film 110 so as to expose a partial surface of the gate electrodes 113, 114 and thus form apertures h7 of the gate electrodes. After the flattening process, there is no need to perform the process of depositing Sin/SiON on the interlayer insulation film in this exemplary embodiment, differently then in the prior art.

Referring to FIG. 5b, a photoresist pattern 206 is formed as a second etching mask pattern for exposing an interval $L_2$ of the apertures h7. The interval $L_2$ is pertinent to a length between inner side ends of the apertures h7 and contains the insulation film provided between the apertures. The pattern 206 is formed by entirely depositing the photoresist on the interlayer insulation film 112 and the apertures h7 through, for example, a spin coating method, and then, by performing a photolithographic process using a block layer as an exposure mask. The block layer is provided to expose the insulation film $L_2$ of the apertures h7 and to block a portion excepting the insulation film $L_2$ provided between the apertures h7. Before depositing the photoresist, an anti-reflective coating (ARC) (not shown) can be generally performed on the insulation film in order to improve the resolution of the photolithographic process. Next, the interlayer insulation film 112 exposed in the pattern by using the photoresist pattern 206 as an etching mask is etched through, for example, a dry etching process such as the plasma dry etching process, etc. to thus form a common recess pattern of the gate electrodes 113, 114 for ensuring a determined thickness D of the interlayer insulation film 112 within the pattern 206. The apertures h7 and the common recess pattern together are provided as a common aperture h8 to connect between the gate electrodes. In this etching, the etching apparatus forming an aperture should be controlled enough to prevent a short between the local interconnection layer 116 and the active region 109. This etching is also desirably performed to be roughly horizontal with the active region of the semiconductor substrate 101. That is, the etching operation should be performed so that the insulation film remains at least higher than the highest height of the gate electrodes, and the thickness of the remaining insulation film desirably has a thickness of between approximately 1200 and 1700 Å. Subsequently, the photoresist pattern 206 remaining on the interlayer insulation film is removed through, for example, an ashing process.

As can be seen in FIG. 5b, since in this exemplary embodiment of the present invention, the common aperture h8 for guaranteeing the determined thickness D of the interlayer insulation film 112 within the photoresist pattern 206 is formed; etching precision is not as critical as in the prior art. That is, the process of forming the hard mask such as SiN/SiON, etc., which was provided to prevent the short between the local interconnection layer 116 of the gate electrodes 113, 114 and the active region 109 is omitted from this exemplary embodiment of the present invention, differently then in the prior art. It is also axiomatic that the process of removing the hard mask is unnecessary in a post process because the hard mask was not formed.

Consequently, in this exemplary embodiment, the manufacturing cost of the semiconductor devices is reduced since it does not require the formation and removal of a hard mask, or a re-progressing CMP process, differently than in the prior art.

The processes after FIG. 5b are the same as the sequential processes of FIGS. 4c and 4d. That is, as shown in FIG. 3d, the pattern 206 is removed from FIG. 5b, then an insulation film 117 of a SiN series is entirely deposited in the common aperture h8 formed by a connection of the apertures h7 and the common recess pattern, and the insulation film 117 is etched to expose a partial surface of the gate electrodes. Subsequently, the metal film 118 is deposited in the common aperture h8 to resulting in a product similar to that illustrated in FIG. 3d.

Next, the common aperture h8 is filled with conductive material such as Al or W or their compound layer, to thus form the metal layer 116 as the local interconnection wiring layer for connecting the gate electrodes. After forming the metal layer 116, a flattening process such as CMP is executed resulting in a product similar to that illustrated in FIG. 3e.

FIGS. 6a and 6b are cross-sectional views showing a sequential formation of the local interconnection wire according to yet other embodiments of the present invention.

Referring first to FIG. 6a, a flattening process such as CMP, etc. is executed to flatten the interlayer insulation film 112 of an oxide series already formed in the previous process, and a photoresist pattern 207 is formed as a first etching mask pattern on the flattened interlayer insulation film 112, the photoresist pattern 207 being for independently exposing a portion of the gate electrodes 113, 114, and a portion $l_3$ of the active region 111. Next, the insulation film exposed into the pattern using the photoresist pattern 207 as an etching mask is etched through, for example, a dry etching process. Then, the etch stop film 110 is etched so as to expose a partial surface of the gate electrodes 113, 114 and a partial surface of the active region, to thus form the apertures h7 of the gate electrodes 113, 114 and an aperture h9 of the active region.

Referring to FIG. 6b, a photoresist pattern 208 as a second etching mask pattern for exposing, an interval $L_2$ of the apertures h7 formed on the gate electrodes, and the aperture h9 of the active region 111, are formed. The interval $L_2$ is pertinent to a length between inner side ends of the apertures h7 and contains the insulation film provided between the apertures. The pattern 208 is formed by depositing the photoresist on the interlayer insulation film 112 and in the apertures h7 of the gate electrodes 113, 114 through, for example, a spin coating method, and then, by performing the photolithographic process using a block layer as an exposure mask. The photolithographic process is performed to expose the insulation film $L_2$ provided between the apertures h7 formed in the upper part of the gate electrodes, and the aperture h9 of the active region, and to block a portion excepting the insulation film $L_2$ between the apertures h7 and the aperture h9 of the active region. Likewise, before depositing the photoresist, an antireflective coating (ARC) film can be deposited on the insulation film so as to improve the resolution of the photolithographic process. Next, the interlayer insulation film 112 exposed in the pattern using the photoresist pattern 208 as an etching mask is etched through, for example, a dry etching process such as the plasma dry etching process, etc. to thus form a common recess pattern of the gate electrodes 113, 114 for ensuring a determined thickness D of the interlayer insulation film 112 within the pattern 208. The apertures h7 and the common recess pattern together are provided as the common aperture h8 for connecting between the gate electrodes 113, 114. In this etching, the etching apparatus forming an aperture should be controlled enough to prevent a short between the local interconnection layer 116 and the active region 109. This etching is desirably performed to be roughly horizontal with the active region of the semiconductor substrate 101. Thus, this etching should be performed so that the insulation film remains at least higher than the highest height of the gate electrodes, wherein the insulation film remains desirably with a thickness of between approximately 1200 and 1700 Å. Subsequently, the photoresist pattern 208 remaining on the interlayer insulation film is removed through, for example, an ashing process.

After the process of FIG. 6b, next processes are performed to resulting in a product similar to that illustrated in FIGS. 4c and 4d. After removing the pattern 208 from FIG. 6b, the insulation film 17 of, for example, a SiN series is entirely deposited in the common aperture h8 and in the aperture h9 of the active region, and the insulation film 117 is etched to expose a partial surface of the gate electrodes 113, 114 and a partial surface ($L_3$) of the active region. Subsequently, the metal film 118 is covered within the common aperture h8 and the aperture h9 of the active region, thus resulting in a product similar to that illustrated in FIG. 4c.

Next, the common aperture h8 and the aperture h9 of the active region are filled with conductive material such as Al or W or their compound layer, to thus form the metal layer 116 as the local interconnection wiring layer for connecting between the gate electrodes 113, 114. After forming the metal layer 116, a flattening process such as CMP is executed resulting in a product similar to that illustrated in FIG. 4d.

As was described above, a common aperture of gate electrodes is formed on an insulation film of a semiconductor substrate so as to have a determined aperture between a local interconnection layer and an active region. Accordingly, the probability of a short between the local interconnection layer and the active region can be reduced and prevented.

In addition, unnecessary processes from processes of forming the local interconnection wire are omitted, thus the total number of processes is reduced, whereby production cost and a defects in devices can be reduced substantially.

Therefore, manufacturing yield of semiconductor devices is enhanced to thereby increase competition of products between semiconductor manufacturers. The present invention will provide more prominent characteristics to a local connection wire between high-integrated semiconductor memory cell transistors.

To these ends, according to one particular aspect of the present invention, a method of forming a local interconnection wire includes forming, on an insulation film, a first etching mask pattern that has a size longer than the length between inner ends of adjacent gate electrodes formed on a semiconductor substrate and covered with the insulation film, and that simultaneously has a length the same as or shorter than the length between outer ends thereof, and subsequently etching the insulation film exposed in the first etching mask pattern so that the insulation film remains higher than the highest height of the gate electrodes, so as to form a recess pattern; removing the first etching mask pattern; forming a second etching mask pattern so as to partially expose the insulation film provided within the recess pattern, and performing an etching, to form apertures for exposing a partial surface of the gate electrodes; removing the second etching mask pattern; and filling up the recess pattern and the apertures with conductive material, to form a local interconnection layer for connecting between the gate electrodes.

According to another aspect of the present invention, a method of forming a local interconnection wire includes forming an etch stop film and an insulation film on a semiconductor substrate on which at least two MOS transistors are formed; forming, on the insulation film, a first etching mask pattern for independently exposing a portion of gate electrodes of the MOS transistors; sequentially etching the insulation film exposed in the first etching mask pattern and the etch stop film, to respectively expose partial surfaces of the gate electrodes and then form apertures; removing the first etching mask pattern; forming a second etching mask pattern for partially exposing the insulation film provided in the apertures; etching the insulation film exposed in the second etching mask pattern by a determined thickness so that the insulation film remains higher than the highest height of the gate electrodes, to thus form a common recess pattern; removing the second etching mask pattern; and filling up the apertures and the common recess pattern formed on the gate electrodes with conductive material, to form a local interconnection layer for connecting between the gate electrodes.

According to another aspect of the present invention, a wiring structure of interconnecting gate electrodes of transistors constituting a memory cell of a semiconductor memory device, in forming a local interconnection wire, includes a reverse U-type interconnection wiring layer, which is surrounded with an insulation film covering the transistors and connects between upper parts of the gate electrodes, and which has a step coverage with the upper parts of the gate electrodes through an insulation film formed higher than the highest height of the gate electrodes in a region between the gate electrodes.

According to the methods of embodiments of the present invention, the probability of a short between upper parts of a local interconnection layer and an active region is reduced, and the number of process steps is substantially reduced since the specific deposition process of a hard mask and its removal and flattening process are unnecessary.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents.

What is claimed is:

1. A method of forming a local interconnection wire, comprising:
    forming, on an insulation film, a first etching mask pattern that exposes a size longer than a length between inner ends of adjacent gate electrodes formed on a semiconductor substrate and covered with the insulation film, said size being equal to or shorter than a length between outer ends of the gate electrodes, and that independently exposes a portion of an active region provided from outer sides of the gate electrodes, and subsequently etching the insulation film exposed in the first etching mask pattern so that the insulation film remains higher than a highest height of the gate electrodes, so as to form a first recess pattern of the gate electrodes and a second recess pattern at the active region;
    removing the first etching mask pattern;
    forming a second etching mask pattern for exposing a partial region in the first recess pattern and the second recess pattern, and then, performing an etching to form a first aperture for exposing a partial surface of the gate electrodes and a second aperture for exposing a partial surface of the active region;
    removing the second etching mask pattern; and
    filling the first and second recess patterns and the first and second apertures with conductive material to form a local interconnection layer.

2. A method of forming a local interconnection wire, comprising:
    forming an etch stop film and an insulation film on a semiconductor substrate on which at least two MOS transistors are formed;
    forming, on the insulation film, a first etching mask pattern for independently exposing a portion of gate electrodes of the MOS transistors;
    sequentially etching the insulation film and the etch stop film exposed in the first etching mask pattern so as to expose a partial surface of the gate electrodes, to thus form apertures;
    removing the first etching mask pattern;
    forming a second etching mask pattern for partially exposing the insulation film provided between the apertures;
    etching, to a determined thickness, the insulation film exposed in the second etching mask pattern so that the insulation film remains higher than a highest height of the gate electrodes, to thus form a common recess pattern;
    removing the second etching mask pattern; and
    filling the apertures and the common recess pattern formed on the gate electrodes with conductive material to form a local interconnection layer for connecting between the gate electrodes.

3. The method as claimed in claim 2, wherein the insulation film is constructed of a double film of SiN and silicon oxide material.

4. The method as claimed in claim 2, wherein a thickness of the remaining insulation film in the common recess pattern has a range of about 1200 Å to 1600 Å.

5. The method as claimed in claim 2, wherein the local interconnection layer is made of tungsten material.

6. The method as claimed in claim 2, further comprising depositing another insulation film in the common recess pattern and the apertures after forming the common recess pattern and the apertures, and subsequently etching the another insulation film so as to expose upper surfaces of the gate electrodes.

7. The method as claimed in claim 6, wherein another insulation film is a SiN series.

8. The method as claimed in claim 6, further comprising forming a metal film in the common recess pattern and the apertures, before the conductive material is filled therein.

9. The method as claimed in claim 8, wherein the metal film is constructed of a compound film of a titanium film and a nitride titanium film.

10. The method as claimed in claim 2, further comprising forming a metal film in the common recess pattern and the apertures, before the conductive material is filled therein.

11. The method as claimed in claim 2, further comprising flattening the formed local interconnection layer.

12. A method of forming a local interconnection wire, comprising:
    forming an etch stop film and an insulation film on a semiconductor substrate on which at least two MOS transistors are formed;
    forming, on the insulation film, a first etching mask pattern for independently exposing a portion of gate electrodes of the MOS transistors and a portion of an active region provided from outer ends of the gate electrodes;
    sequentially etching the insulation film and the etch stop film exposed in the first etching mask pattern so as to each expose partial surfaces of the gate electrodes and the active region, to thus form apertures;
    removing the first etching mask pattern;
    forming a second etching mask pattern for partially exposing the insulation film provided between the apertures formed on the gate electrodes;
    etching, to a determined thickness, the insulation film exposed in the second etching mask pattern so that the insulation film remains higher than a highest height of the gate electrodes, to thus fond a common recess pattern;
    removing the second etching mask pattern; and
    filling, with conductive material, the apertures and the common recess pattern formed on the gate electrodes, and the aperture formed on the active region, to thus form a local interconnection layer.

13. A method of forming a local interconnection wire, comprising:
    forming, on an insulation film, a first etching mask pattern that has a length greater than a length between inner ends of adjacent gate electrodes formed on a semiconductor substrate, the insulation film covering the gate electrodes;
    forming a recess pattern in the insulation film to a level above a height of a taller of the gate electrodes;
    removing the first etching mask pattern;
    forming a second etching mask pattern that partially exposes the insulation film within the previously exposed region;
    forming apertures to expose a partial surface of the gate electrodes;
    removing the second etching mask pattern; and
    forming a local interconnection layer of a conductive material in the recess pattern and the apertures to connect between the gate electrodes.

14. The method of claim 13 wherein the recess pattern is approximately horizontal to a surface of the substrate.

15. The method of claim 13 wherein the recess pattern has a thickness of approximately between 1200 and 1700 Å.

16. The method of claim 13 wherein, after the second etching mask is removed and before the recess pattern is filled:
    depositing a second insulating film in the common apertures; and
    etching the second insulation film to expose a partial surface of the gate electrodes.

* * * * *

UNITED STATES PATENT AND TRADEMARK OFFICE
CERTIFICATE OF CORRECTION

PATENT NO.         : 7,498,253 B2
APPLICATION NO. : 11/679722
DATED                 : March 3, 2009
INVENTOR(S)       : Sung-Un Kwon et al.

It is certified that error appears in the above-identified patent and that said Letters Patent is hereby corrected as shown below:

Column 2, line 22, the word "(l)" should read -- ($\ell$) --;

Column 2, line 25, the word "(l)" should read -- ($\ell$) --;

Column 3, line 19, the word "($l_1$)" should read -- ($\ell_1$) --;

Column 3, line 20, the word "($l_2$)" should read -- ($\ell_2$) --;

Column 3, line 23, the word "($l_1$)" should read -- ($\ell_1$) --;

Column 3, line 38, the word "($l_2$)" should read -- ($\ell_2$) --;

Column 9, line 62, the word "($l_3$)" should read -- ($\ell_3$) --;

Column 10, line 46, the word "17" should read -- 117 --;

Column 14, line 2, the word "fond" should read -- form --.

Signed and Sealed this

Twenty-seventh Day of October, 2009

David J. Kappos
*Director of the United States Patent and Trademark Office*